(12) United States Patent
Aflatooni et al.

(10) Patent No.: US 10,089,931 B2
(45) Date of Patent: Oct. 2, 2018

(54) ORGANIC LIGHT-EMITTING DIODE DISPLAY WITH SMOOTH DIMMING CONTROL

(71) Applicant: Apple Inc., Cupertino, CA (US)

(72) Inventors: Koorosh Aflatooni, Los Altos Hills, CA (US); Yafei Bi, Palo Alto, CA (US); Hung Sheng Lin, San Jose, CA (US); Mohammad Ali Jangda, San Jose, CA (US)

(73) Assignee: Apple Inc., Cupertino, CA (US)

( * ) Notice: Subject to any disclaimer, the term of this patent is extended or adjusted under 35 U.S.C. 154(b) by 135 days.

(21) Appl. No.: 14/990,701

(22) Filed: Jan. 7, 2016

(65) Prior Publication Data

US 2016/0284275 A1    Sep. 29, 2016

Related U.S. Application Data

(60) Provisional application No. 62/138,915, filed on Mar. 26, 2015.

(51) Int. Cl.
*G09G 3/32* (2016.01)
*G09G 3/20* (2006.01)
*G09G 3/3258* (2016.01)
*H03M 1/72* (2006.01)
*H03M 1/76* (2006.01)

(52) U.S. Cl.
CPC ......... *G09G 3/3258* (2013.01); *G09G 3/2007* (2013.01); *H03M 1/72* (2013.01); *G09G 2310/027* (2013.01); *G09G 2320/0606* (2013.01); *G09G 2320/0626* (2013.01); *G09G 2320/0653* (2013.01); *G09G 2320/0673* (2013.01); *G09G 2320/0693* (2013.01); *G09G 2320/08* (2013.01); *G09G 2330/021* (2013.01); *G09G 2360/144* (2013.01); *G09G 2360/16* (2013.01); *H03M 1/765* (2013.01)

(58) Field of Classification Search
USPC ................................................... 345/690, 89
See application file for complete search history.

(56) References Cited

U.S. PATENT DOCUMENTS

| | | | |
|---|---|---|---|
| 2010/0007680 | A1* | 1/2010 | Yu .................. G09G 3/2003 345/690 |
| 2011/0069098 | A1 | 3/2011 | Lee et al. |
| 2012/0098870 | A1 | 4/2012 | Barnhoefer et al. |
| 2013/0249955 | A1 | 9/2013 | Kim et al. |

(Continued)

*Primary Examiner* — Jennifer Mehmood
*Assistant Examiner* — Deeprose Subedi
(74) *Attorney, Agent, or Firm* — Treyz Law Group, P.C.; Jason Tsai

(57) ABSTRACT

An electronic device that includes a display is provided. The display may have a brightness that is controlled using a series of cascaded digital-to-analog converter circuits. The display may be calibrated at a series of predetermined display brightness settings. For display brightness settings that fall between two consecutive display brightness settings in the series of predetermined display brightness settings, voltage interpolation operations may be performed to obtain the corresponding display brightness settings. Performing voltage interpolations instead of digital brightness setting interpolation helps minimize luminance jumps and unexpected color shifts when adjusting the brightness of the display.

20 Claims, 12 Drawing Sheets

(56) References Cited

U.S. PATENT DOCUMENTS

| | | | | |
|---|---|---|---|---|
| 2013/0314459 A1* | 11/2013 | Nakanishi | ............ | G09G 3/3406 345/694 |
| 2014/0146090 A1* | 5/2014 | Oh | ........................... | G09G 3/20 345/690 |
| 2014/0184657 A1* | 7/2014 | Lee | ........................ | G09G 5/10 345/690 |
| 2015/0123955 A1 | 5/2015 | Bi et al. | | |

* cited by examiner

ORGANIC LIGHT-EMITTING DIODE DISPLAY WITH SMOOTH DIMMING CONTROL

This application claims the benefit of provisional patent application No. 62/138,915, filed Mar. 26, 2015 which is hereby incorporated by reference herein in its entirety.

BACKGROUND

This relates generally to electronic devices, and more particularly, to electronic devices with displays.

Electronic devices often include displays. For example, cellular telephones and portable computers often include organic light-emitting diode displays for presenting visual information to a user.

To ensure that organic light-emitting diode displays do not consume too much power, electronic devices often use a peak luminance control algorithm (sometimes referred to as automatic current limiting). When this functionality is enabled, the peak luminance of displayed images is limited whenever the content being displayed exhibits large values of average luminance. When the average luminance of a frame of image data is low, the display is allowed to display content with a large peak luminance. In this situation, a display with sparse content such as a few icons on a black background can display the content brightly.

When the average luminance of a frame of image data is high, there is a potential for excessive current draw by the display if all of the content in the frame is displayed at maximum luminance. When the peak luminance control algorithm is used, the peak luminance of the content is reduced automatically by the display. This ensures that the amount of current and therefore the amount of power that is drawn by the display will be capped. In addition to limiting power consumption, this may help limit temperature rise in the display and thereby help extend the lifetime of display pixels in the display.

Manually and automatically controlled display brightness settings also are used to adjust how brightly organic light-emitting diode displays operate. Organic light-emitting diode displays produce light by applying current to emissive organic materials. Conventionally, analog data signals are driven to corresponding thin-film transistors that pass the current to the emissive organic materials. The analog data signals are typically derived based on a set of reference voltages values, which are calibrated for specific display brightness settings. The display may include a display driver having a cascaded gamma circuit for generating the set of reference voltage values.

In particular, the display brightness settings can be adjusted to dim the brightness of the display by scaling the references voltages using the cascaded gamma circuit. As the voltage scales, the display needs to be re-calibrated to maintain the accuracy of the color that is being displayed. When a user of the displays adjusts the display brightness settings to intermediate levels that are between the calibrated brightness settings, the reference voltage values may be interpolated from the calibrated settings. In particular, the interpolation is performed in the digital domain. Because of the cascaded structure of the gamma circuit, digital interpolation introduces errors that can ripple and accumulate across the reference voltages, which can lead to luminance jumps (especially at low dimming levels) and unexpected color shifts in the display.

SUMMARY

An electronic device may include display circuitry for displaying image content to a user. In accordance with an embodiment, the display circuitry may include multiple cascaded data converters (e.g., digital-to-analog data converting circuits) configured to generate reference voltages and interpolation circuitry that generates register settings for configuring the cascaded data converters and that performs voltage interpolation when generating the register settings.

The electronic device may also include memory for storing predetermined scaling factors that are retrieved when performing the voltage interpolation. Each of the cascaded data converters is associated with a respective digital value that is used to compute the predetermined scaling factors. The interpolation circuitry may be configured to compute delta values based on the digital values associated with the cascaded data converters. The interpolation circuitry is further configured to compute a ratio based on the predetermined scaling factors and the delta values. The register settings may be computed based on the ratio and a user display brightness setting.

In accordance with another embodiment, a method for operating a display that is characterized by a plurality of dimming bands is provided. Each dimming band may be defined by a right edge and a left edge. The method may involve placing the display in a first state using a first display brightness setting (e.g., a calibrated setting) that corresponds to one of the right and left edges of a first dimming band in the plurality of dimming bands, placing the display in a second state by adjusting the first display brightness setting to a second display brightness setting, and in response to determining that the second display brightness setting falls between the right and left edges of the first dimming band, performing voltage interpolation operations to obtain additional display control settings.

The voltage interpolation operations may include performing linear interpolation between a first voltage value corresponding to the right edge of the first dimming band and a second voltage value corresponding to the left edge of the first dimming band, where the first and second voltage values correspond to an identical gray level. Performing voltage interpolation in this way can generate additional display control settings for a set of predetermined tap points which define a gamma characteristic for the display. The additional display control settings may be used to configure a plurality of cascaded digital-to-analog converters having outputs connected to the predetermined tap points.

Further features of the invention, its nature and various advantages will be more apparent from the accompanying drawings and following detailed description.

DETAILED DESCRIPTION

Electronic devices may include displays. The displays may be used to display images to a user. Illustrative electronic devices that may be provided with displays are shown in FIGS. 1, 2, 3, and 4.

Figure 1:
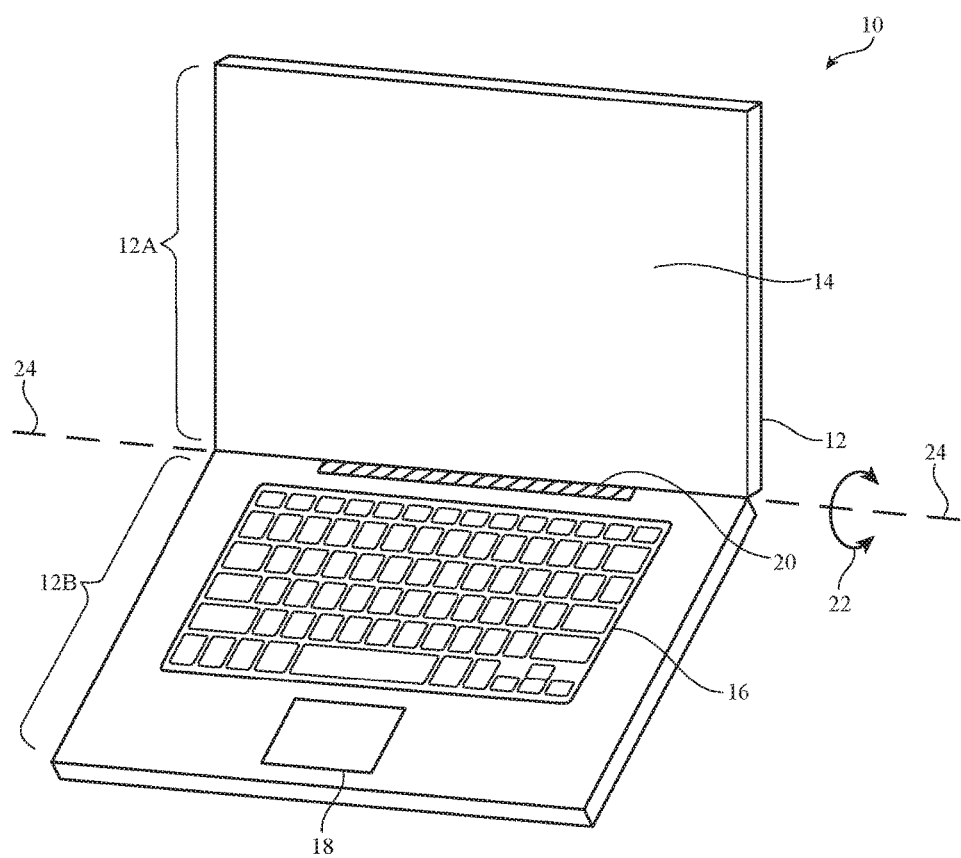
FIG. 1 is a perspective view of an illustrative electronic device such as a laptop computer with a display in accordance with an embodiment.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
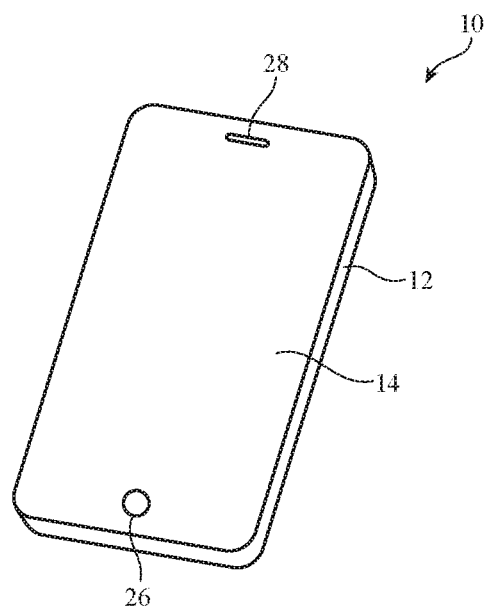
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
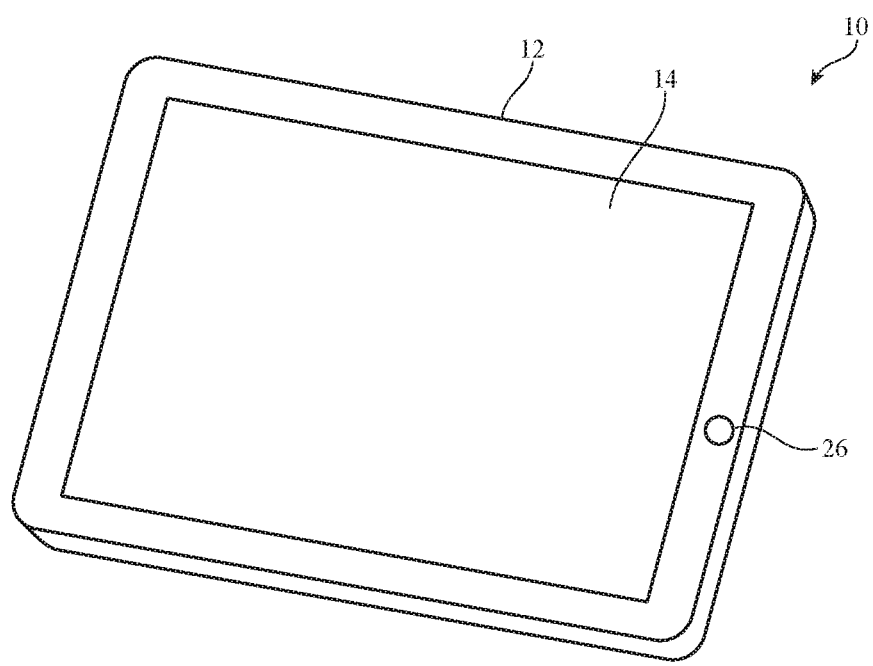
FIG. 3 is a perspective view of an illustrative electronic device such as a tablet computer with a display in accordance with an embodiment.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
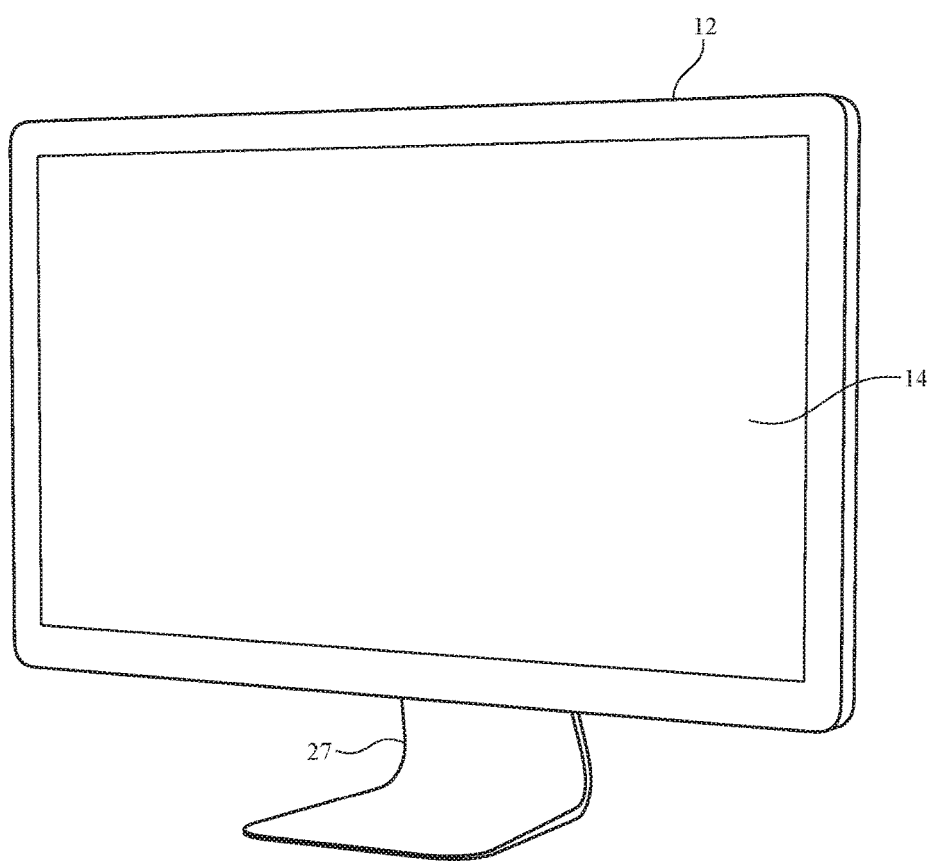
FIG. 4 is a perspective view of an illustrative electronic device such as a computer display with a display in accordance with an embodiment.

FIG. 4 shows how electronic device 10 may be a computer display or a computer that has been integrated into a computer display. With this type of arrangement, housing 12 for device 10 may be mounted on a support structure such as stand 27. Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from organic light-emitting diode (OLED) display components or other suitable display pixel structures.

Figure 5:
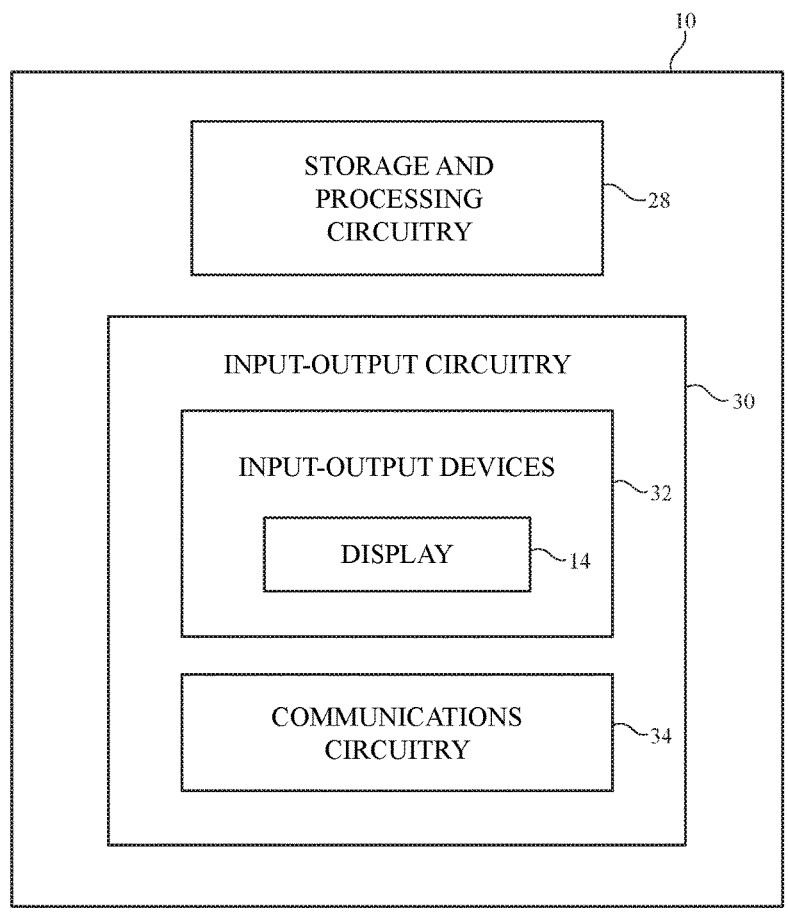
FIG. 5 is a schematic diagram of an illustrative electronic device with a display in accordance with an embodiment.

A schematic diagram of an illustrative configuration that may be used for electronic device 10 is shown in FIG. 5. As shown in FIG. 5, electronic device 10 may include control circuitry such as storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. The processing circuitry may be based on one or more microprocessors, microcontrollers, digital signal processors, baseband processors, power management units, audio codec chips, application specific integrated circuits, etc. If desired, storage and processing circuitry 28 may include a system-on-chip integrated circuit or multiple system-on-chip devices.

Storage and processing circuitry 28 may be used to run software on device 10, such as internet browsing applications, voice-over-internet-protocol (VOIP) telephone call applications, email applications, media playback applications, operating system functions, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, etc.

Circuitry 28 may supply display 14 with content that is to be displayed on display 14. The content may include still image content and moving image content such as video content for a movie, moving graphics, or other moving image content. Image data for the content that is being displayed by display 14 may be conveyed between control circuitry 28 and display driver circuitry in display 14 over a data path (e.g., a flexible circuit cable with multiple parallel metal traces that serve as signal lines or other suitable communications path).

Input-output circuitry 30 may be used to allow data to be supplied to device 10 and to allow data to be provided from device 10 to external devices. Input-output circuitry 30 may include input-output devices 32. Input-output devices 32 may include one or more displays such as display 14 (e.g., an organic light-emitting diode display). Input-output devices 32 may also include touch screens, buttons, joysticks, click wheels, scrolling wheels, touch pads, key pads, keyboards, light-emitting diodes and other status indicators, data ports, etc. Input-output devices 32 may also include sensors and audio components. For example, input-output devices 32 may include an ambient light sensor, a proximity sensor, a gyroscope, an accelerometer, cameras, a temperature sensor, audio components such as speakers, tone generators, and vibrators or other audio output devices that produce sound, microphones, and other input-output components.

During operation, a user can control the operation of device 10 by supplying commands through input-output devices 32 and may receive status information and other output from device 10 using the output resources of input-output devices 32.

Communications circuitry 34 may include wired and wireless communications circuitry for supporting communications between device 10 and external equipment.

Figure 6:
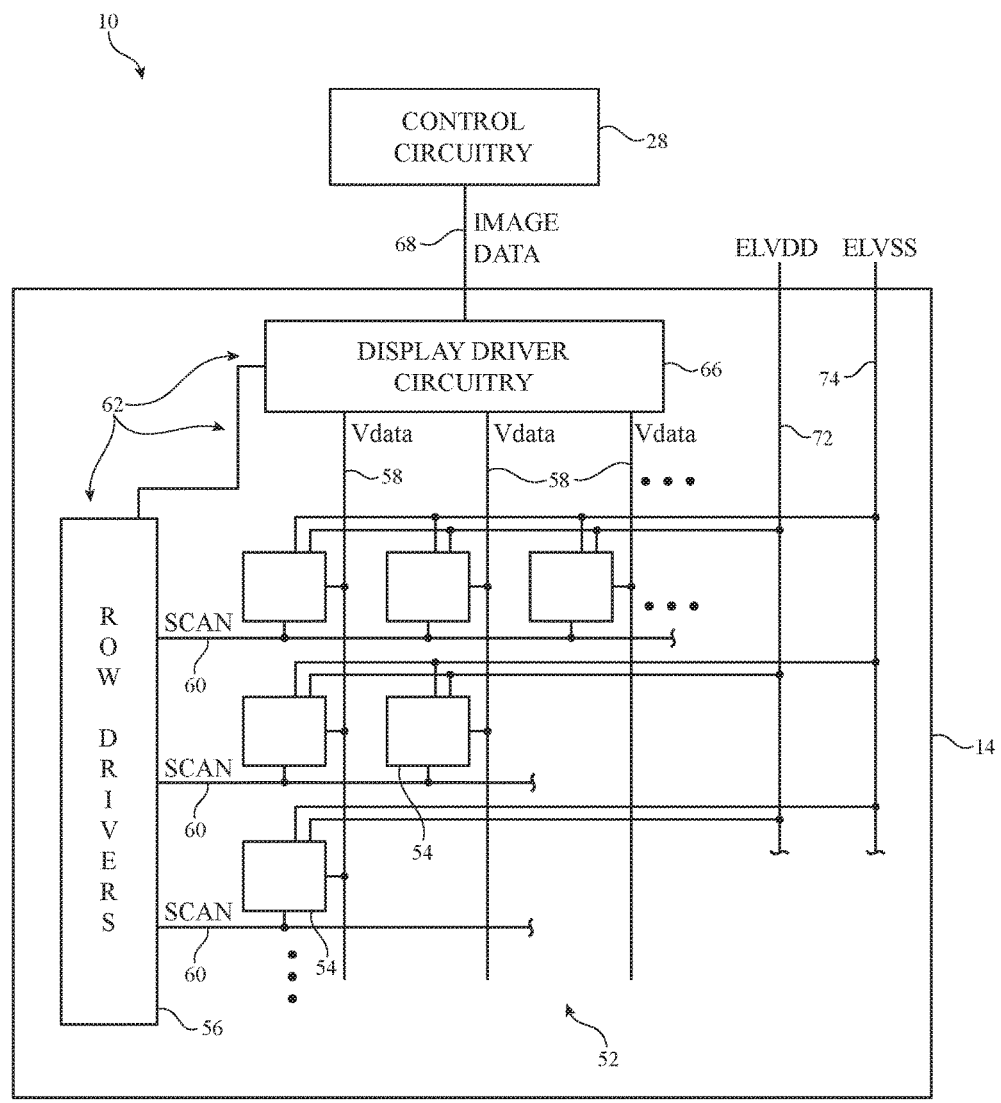
FIG. 6 is a diagram of display circuitry in accordance with an embodiment.

A circuit diagram of display 14 and other circuitry in device 10 is shown in FIG. 6. As shown in the illustrative configuration of FIG. 6, display 14 may have display pixels 54 organized in an array such as display pixel array 52. Display pixel array 52 may contain rows and columns of organic light-emitting diode display pixels 54 (e.g., tens, hundreds, or thousands or more rows and/or columns). Display driver circuitry 62 may include display driver circuitry 66. Display driver circuitry 66 may be implemented using an integrated circuit (e.g., display driver circuitry 66 may include a display driver integrated circuit). Display driver circuitry 66 may include timing controller circuitry and may therefore sometimes be referred to as a timing controller (TCON) chip or timing controller integrated circuit.

Display driver circuitry 62 may include display driver circuitry 66, row driver circuitry 56, and column driver circuitry. Row driver circuitry 56 may, if desired, be implemented using thin-film transistor circuitry on the substrate of display 14 or other circuitry (e.g., circuitry in an integrated circuit). Thin-film transistor circuitry may also be used to form array 52. The column driver circuitry for display 14 may, as an example, be formed using an integrated circuit that is mounted on the substrate of display 14.

Column driver circuitry may be implemented in an integrated circuit (e.g., a column driver integrated circuit—sometimes referred to as a source driver) that is separate from a timing controller integrated circuit that is being used to implement display driver circuitry 66 or may be formed as an integral part of a timing controller integrated circuit used in implementing display driver circuitry 66.

Display driver circuitry 62 (e.g. display driver integrated circuit 66) may receive still and/or moving image data (sometimes referred to as display or image data) from control circuitry 28 using communications path 68. In response, display driver circuitry 62 may provide control signals to pixels 54 on lines 58 and 60. In particular, display driver circuitry 62 may provide corresponding analog data signals Vdata on data lines 58 and may use row drivers 56 to provide scan signals SCAN on scan lines 60. There may be a different respective data line 58 for each column of display pixels 54 in display pixel array 52 and a different respective scan line 60 for each row of display pixels 54.

Power can be provided to display 14 using a power management unit integrated circuit. A power management unit may, for example, provide each of the display pixels 54 in display pixel array 52 with a positive power supply voltage ELVDD using positive power supply path 72 and a ground power supply voltage ELVSS using ground power supply path 74.

Display driver circuitry 66 may analyze image data from control circuitry 28 that is received over path 68. This analysis may, for example, reveal information on the content of the image data such as the average luminance of each frame of the image data. Using information such as average luminance information, display driver circuitry 66 can implement functions such peak luminance control functions. Brightness control functions may be used to adjust display brightness based on manual user input and/or ambient light sensor data (as examples).

Figure 7:
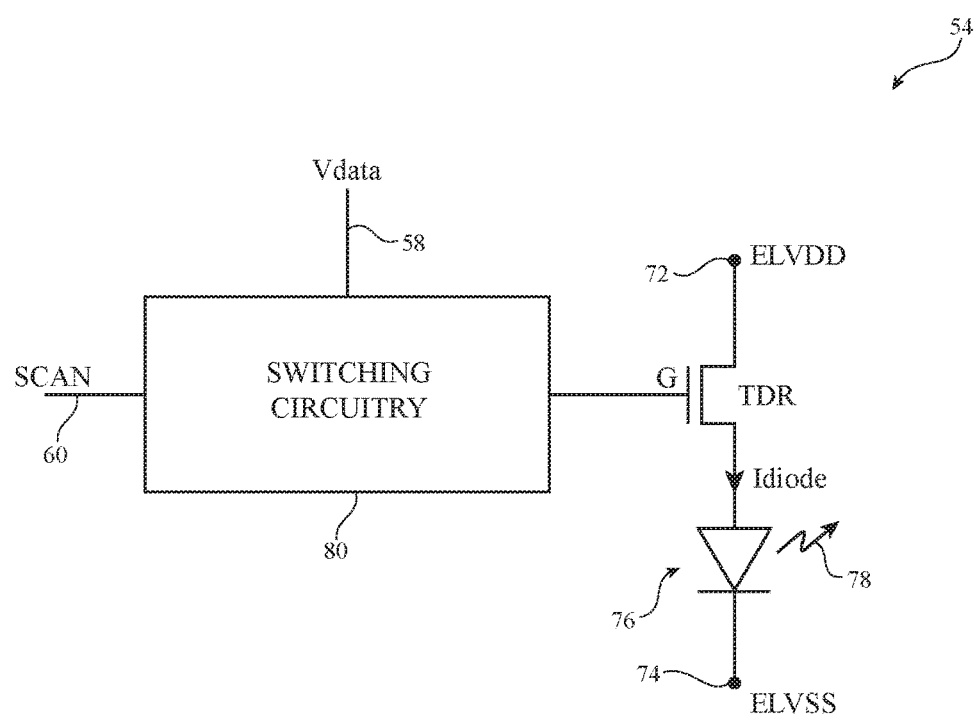
FIG. 7 is a schematic diagram of an illustrative organic light-emitting diode display pixel in accordance with an embodiment.

A circuit diagram of an illustrative display pixel in display pixel array 52 of display 14 is shown in FIG. 7. The circuitry of illustrative display pixel 54 of FIG. 7 contains thin-film transistor (TFT) switching circuitry 80 for controlling the application of data signal Vdata to gate G of drive transistor TDR in response to scan signal SCAN being asserted (taken high). Transistor TDR is used to apply current Idiode to organic light-emitting diode 76. The amount of light 78 that is produced by light-emitting diode 76 can be adjusted by adjusting the magnitude of current Idiode. The FIG. 7 example includes current regulating (drive) transistor TDR and switching circuitry 80. This is merely illustrative. Other configurations may be used for the circuitry of display pixel 54 if desired. In general, display pixel 54 may contain any suitable number of transistors (e.g., two or more, three or more, four or more, five or more, six or more, etc.). Capacitor structures may, if desired, be used to store data on a pixel between successive frames.

Transistor TDR and diode 76 are connected in series between positive power supply terminal 72 and ground power supply terminal 74. The drain terminal of transistor TDR is coupled to positive power supply terminal 72 and the source terminal of transistor TDR is coupled to light-emitting diode 76 at the anode terminal of light-emitting diode 76. The cathode terminal of light-emitting diode 76 is coupled to ground power supply terminal ELVSS. Positive power supply voltage terminal 72 may receive positive power supply voltage ELVDD. Ground power supply voltage terminal 74 may receive ground power supply voltage ELVSS. The voltage that is applied to gate G of transistor TDR by switching circuitry 80 controls the magnitude of diode current Idiode and therefore the amount of light 78 that is emitted by display pixel 54.

If care is not taken, the performance of a display pixel can deteriorate when operated for extended periods of time at large values of diode current Idiode, particularly under conditions where the temperature of diode 76 is elevated. Static image content on display 14 that produces elevated Idiode values therefore may undesirably burn images into display 14. To avoid undesired image burn-in effects, display driver circuitry 66 may detect the presence of static image content and may take appropriate actions to adjust the drive currents to the diodes in the pixel array to minimize image burn-in effects. For example, display driver circuitry 66 may reduce the drive currents Idiode in some or all of pixels 54 using display brightness adjustments, using adjustments to a peak luminance value in a peak luminance control algorithm, or by mapping bright display pixel data values to less bright display pixel values.

Figure 8:
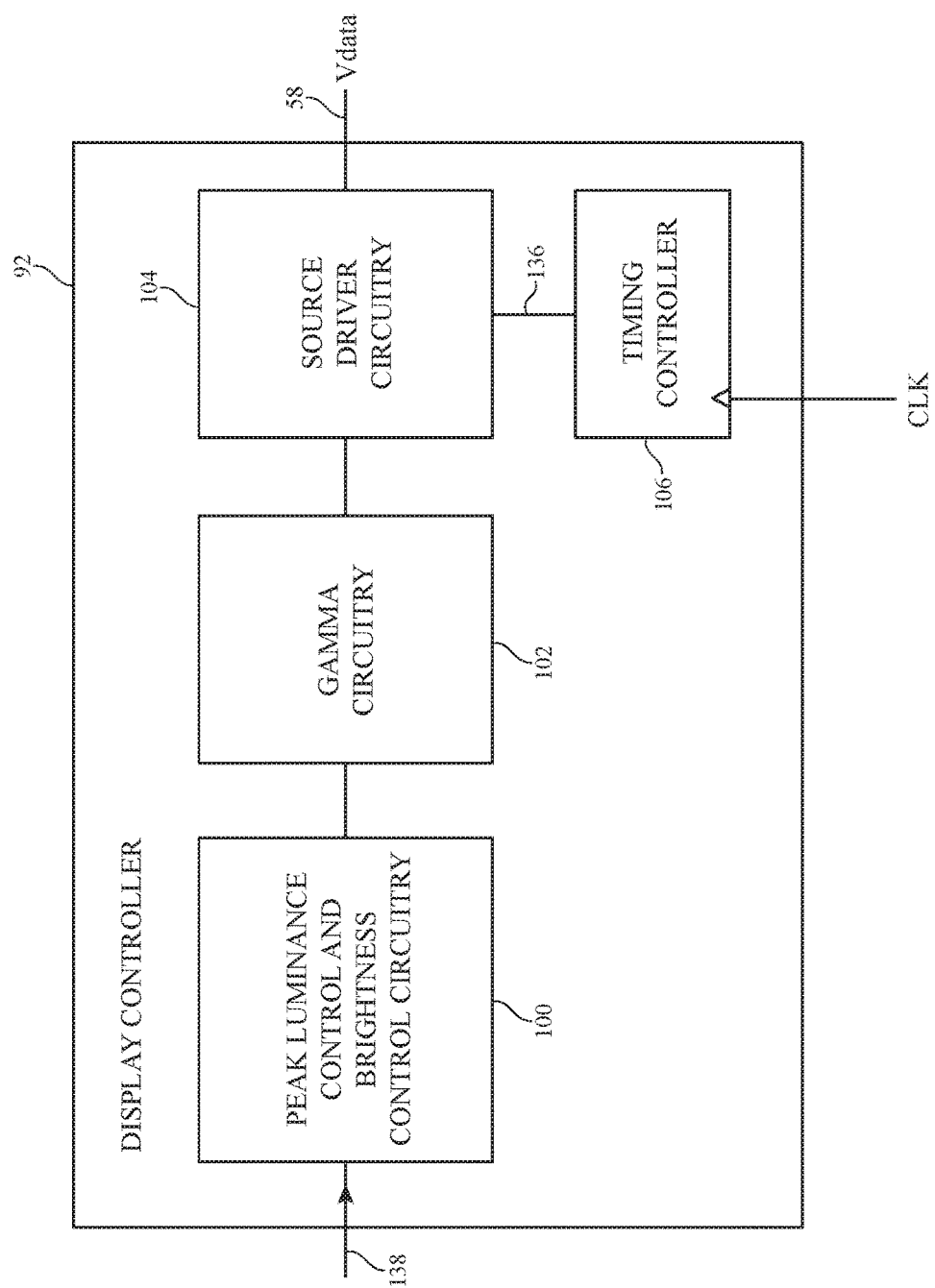
FIG. 8 is a diagram of an illustrative display controller in accordance with an embodiment.

Illustrative display controller circuitry that may be included in display driver circuitry 66 of FIG. 6 is shown in FIG. 8. Display controller 92 may be used to supply data signals Vdata to display pixel array 52 using output 58. As shown in FIG. 8, display controller 92 may include peak luminance control and brightness control circuitry 100, gamma circuitry 102, source driver circuitry 104, and a timing controller 106.

Timing controller 106 may display data on display pixels 54 of array 52 by providing data to source drivers 104 via path 136. In response to receive of data from timing controller 106 on path 136, corresponding analog data signals Vdata may be supplied by source driver circuitry 104 to display pixel array 52 via lines 58.

The relationship between the value of the digital data supplied by timing controller 106 and the resulting luminance of display pixels 54 (i.e., the magnitude of analog data signals Vdata) is defined by a function that is sometimes referred to as a gamma curve. Gamma circuitry 102 may contain a resistor ladder that helps define the shape of the gamma curve. Using multiplexing circuitry that is responsive to the digital data from timing controller 106, gamma circuitry 102 and source driver circuitry 104 may drive analog output signals Vdata onto the lines of path 58.

Peak luminance control and brightness control circuitry 100 may be used to implement display brightness control functions. For example, circuitry 100 may be used in making display brightness adjustments responsive to user brightness settings input and/or automatic brightness levels determined using ambient light measurements from an ambient light sensor. Image data that is to be displayed may be received by peak luminance control and brightness control circuitry 100 via path 138. Circuitry 100 can process the image data and can compute image data parameters such as average luminance values for received data frames.

Based on average luminance values for the frames of data that are being displayed on array 52 or other information, circuitry 100 may control peak luminance values for display 14. If, for example, average luminance is high, a peak luminance control algorithm that is implemented on circuitry 100 may select a gamma curve using gamma circuitry 102 that is appropriate for displaying image data with a reduced peak luminance. When average luminance is low, the peak luminance control algorithm may select a different gamma curve. In addition to adjusting diode currents Idiode in array 52 by implementing different peak luminance values using a peak luminance control algorithm, circuitry 100 may adjust diode currents by adjusting display brightness settings. Brightness control (e.g., global dimming or brightening of all of the display pixels 54 in array 52) may, for example, be performed by circuitry 100 in response to user dimming settings and/or ambient light data from an ambient light sensor.

Figure 9:
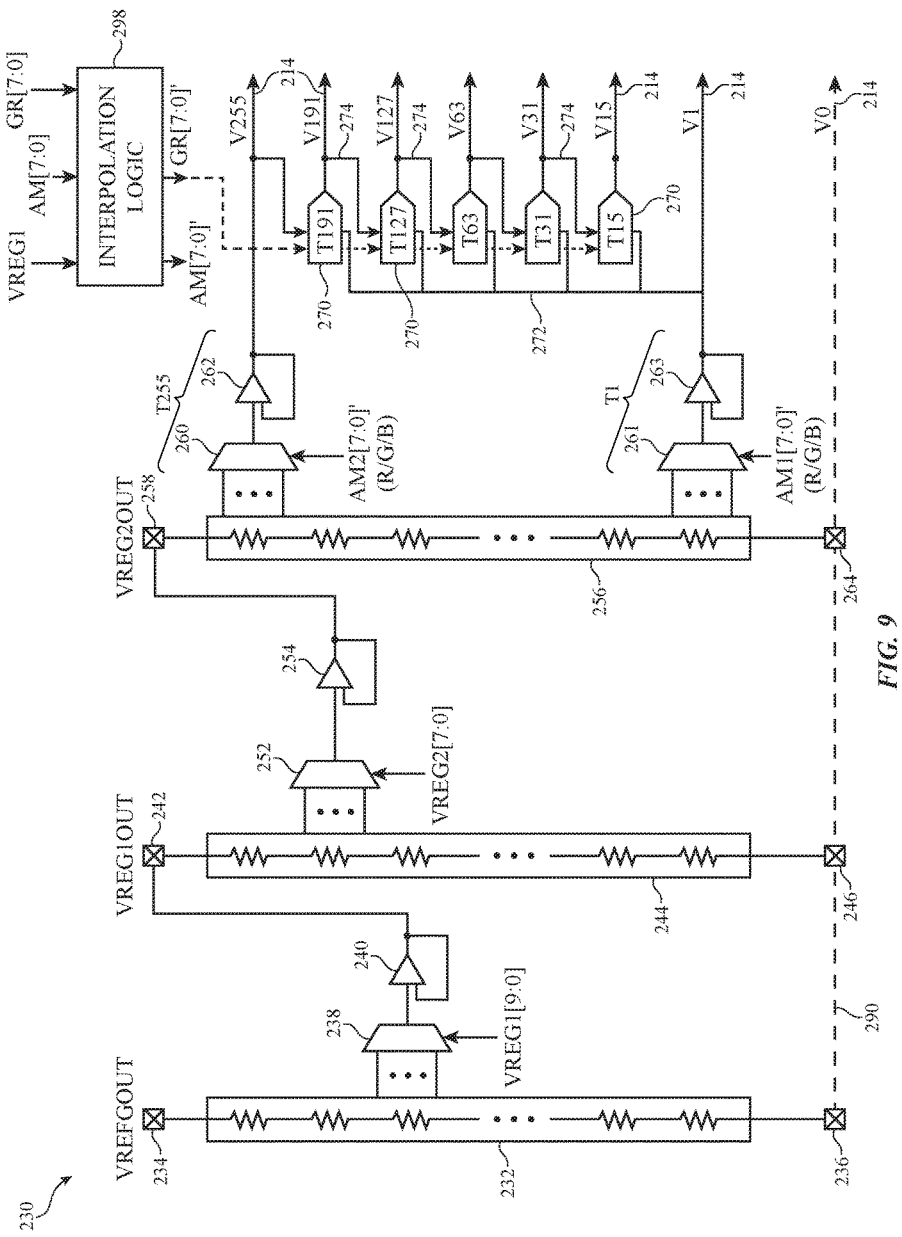
FIG. 9 is a circuit diagram of reference voltage generation circuitry that includes voltage interpolation logic in accordance with an embodiment.

Illustrative display reference voltage generation circuitry that may be used in displaying images on display 14 using a gamma curve selected based on inputs such as a display brightness setting and a peak luminance control scaling factor is shown in FIG. 9. As shown in FIG. 9, reference voltage generation circuitry 230 may receive inputs such as a display brightness setting VREG1[9:0] and a peak luminance control scaling factor VREG2[7:0] and may produce corresponding reference voltages V255, V191, V127, . . . , V15, V0 on paths 214. The magnitude of the voltages on paths 214 can be supplied to additional digital-to-analog converter (DAC) circuitry (not shown in FIG. 9) for use in producing analog output signals Vdata corresponding to the digital image data that is to be displayed. In general, signals Vdata generated in this way can be distributed to red (R), green (G), and blue (B) display pixels in the display pixel array in a time multiplexed fashion.

In the illustrative configuration of FIG. 9, circuitry 230 includes digital-to-analog converter (DAC) circuitry for converting digital inputs to analog outputs. For example, the digital input signal VREG1[9:0] that corresponds to the user brightness setting can be converted to an analog output signal VREG1OUT using a digital-to-analog converter circuit that includes resistor ladder 232, multiplexer 238, and buffer 240. Resistor ladder 232 may be provided with a first voltage (VREFGOUT) on terminal 234 and a second voltage on terminal 236. Resistors in resistor ladder 232 may be coupled in series between terminals 234 and 236. Terminal 236 may be provided with a fixed voltage (e.g., a ground voltage). Multiplexer 238 may have a digital input that receives user brightness setting VREG1[9:0]. The inputs to multiplexer 238 are coupled to the resistor terminals of the resistors in resistor ladder 232. In response to its digital input, multiplexer 238 will couple a selected one of its inputs to its output, which is passed to terminal 242 as voltage VREG1OUT. The value of VREG1OUT is determined by the user-selected brightness setting. When a user does not dim display 14, VREG1OUT will have its maximum value. When a user dims display 14, VREG1OUT will have a reduced magnitude.

The VREG1OUT signal is provided to another digital-to-analog converter circuit that receives digital input VREG2[7:0]. This DAC circuit includes resistor ladder 244, multiplexer 252, and buffer 254. Resistor ladder 244 has a chain of resistors coupled in series between terminal 242 and terminal 246. Terminal 246 may be provided with a fixed voltage (e.g., ground). Terminal 242 receives voltage VREG1OUT, which is determined by the user brightness setting. The inputs of multiplexer 252 are coupled to the terminals of the resistors in resistor ladder 244. The output of multiplexer 252 is passed to terminal 258 via buffer 254.

Peak luminance control circuitry 100 (FIG. 8) may be used to implement a peak luminance control algorithm. Circuitry 100 may, for example, receive frames of image data signals and may analyze the data associated with each image frame to compute image characteristics such as average luminance (e.g., the average luminance of each frame). A peak luminance control algorithm may be used to produce a desired peak luminance scaling factor VREG2[7:0] in response to the computed average luminance value or from other information gathered from the image data.

In response to receiving the peak luminance control algorithm scaling factor VREG2[7:0], multiplexer 252 may supply output voltage VREGOUT2 to terminal 258 of resistor ladder 256. The scaling factor supplied to the input of multiplexer 252 directs multiplexer 252 to produce a value of VREGOUT2 that is a scaled version of the voltage VREG1OUT on terminal 242 of resistor ladder 244. The value of VREGOUT2 is therefore a function both of the user brightness setting supplied to multiplexer 238 and the peak luminance control algorithm scaling factor provided to multiplexer 252.

The value of VREGOUT2 may be used in producing the voltages on path 214. Still referring to FIG. 9, a resistor ladder 256 includes a chain of resistor that are coupled between terminals 258 and 264. A fixed voltage may be provided to terminal 264 (e.g., a ground power supply voltage signal V0). If desired, the ground reference voltage V0 may be provided to terminal 264 and to terminals 236 and 246 via a common shorting path 290 (as an example).

Resistor ladder 256 may be coupled to a plurality of digital-to-analog converter (DAC) circuits that arranged in a cascaded chain. A first DAC circuit in the chain may include multiplexer 260 having inputs coupled to resistor ladder 256, control inputs that receive register settings AM2[7:0]', and an output that is coupled to a first path 214 (e.g., an output path on which reference voltage V255 is generated) via buffer 262. Register settings AM2 that are used in generating V255 are sometimes represented herein as a digital value T255. Value T255 may, for example, be a value between zero and one that is reflective of how far V255 is away from the lower reference voltage V1.

Voltage V255 may be used to power a second DAC circuit 270 in the chain (as indicated by cascaded path 274). Although not explicitly shown, the second DAC circuit 270 may also include its own resistor ladder and multiplexer for selectively outputting reference voltage V191 on a second output path 214 based on register settings GR5[7:0]'. Register settings GR5 that are used in generating V191 are sometimes represented herein as a digital value T191. Value T191 may, for example, be a value between zero and one that is reflective of how far V191 is away from the lower reference voltage V1 (e.g., $T191=V191/[V255-V1]$).

Similarly, voltage V191 may be used to power a third DAC circuit 270 in the chain. Although not explicitly shown, the third DAC circuit 270 may also include its own resistor ladder and multiplexer for selectively outputting reference voltage V127 on a third output path 214 based on register settings GR4[7:0]'. Register settings GR4 that are used in generating V127 are sometimes represented herein as a digital value T127. Value T127 may, for example, be a value between zero and one that is reflective of how far V127 is away from the lower reference voltage V1 (e.g., $T127=V127/[V255-V1]$).

Voltage V127 may be used to power a fourth DAC circuit 270 in the chain. Although not explicitly shown, the fourth DAC circuit 270 may also include its own resistor ladder and multiplexer for selectively outputting reference voltage V63 on a fourth output path 214 based on register settings GR3[7:0]'. Register settings GR3 that are used in generating V63 are sometimes represented herein as a digital value T63.

Voltage V63 may be used to power a fifth DAC circuit 270 in the chain. Although not explicitly shown, the fifth DAC circuit 270 may also include its own resistor ladder and multiplexer for selectively outputting reference voltage V31 on a fifth output path 214 based on register settings GR2[7:0]'. Register settings GR2 that are used in generating V31 are sometimes represented herein as a digital value T31.

Voltage V31 may be used to power a sixth DAC circuit 270 in the chain. Although not explicitly shown, the sixth DAC circuit 270 may also include its own resistor ladder and multiplexer for selectively outputting reference voltage V15 on a sixth output path 214 based on register settings GR1[7:0]'. Register settings GR1 that are used in generating V15 are sometimes represented herein as a digital value T15.

A seventh DAC circuit in the chain may include multiplexer 261 having inputs coupled to resistor ladder 256, control inputs that receive register settings AM1[7:0]', and an output that is coupled to a seventh path 214 (e.g., an output path on which reference voltage V1 is generated) via buffer 263. Register settings AM1 that are used in generating V1 are sometimes represented herein as a digital value T1. In the example of FIG. 9, signal V1 may also be used as a low power supply voltage to power the resistor chains in each of the second, third, fourth, fifth, and sixth DAC circuits 270 in the chain.

The reference voltages V255-V1 generated in this way help establish a desired gamma curve corresponding to the user brightness setting and peak luminance control scaling factor. The portion of circuitry 230 that includes the chained DAC circuits 270 is therefore sometimes referred to collectively as a cascaded gamma structure. Each of the seven reference voltages V255, V191, V127, V63, V31, V15, and V1 generated in this way are often referred to as "tap points."

Figure 10:
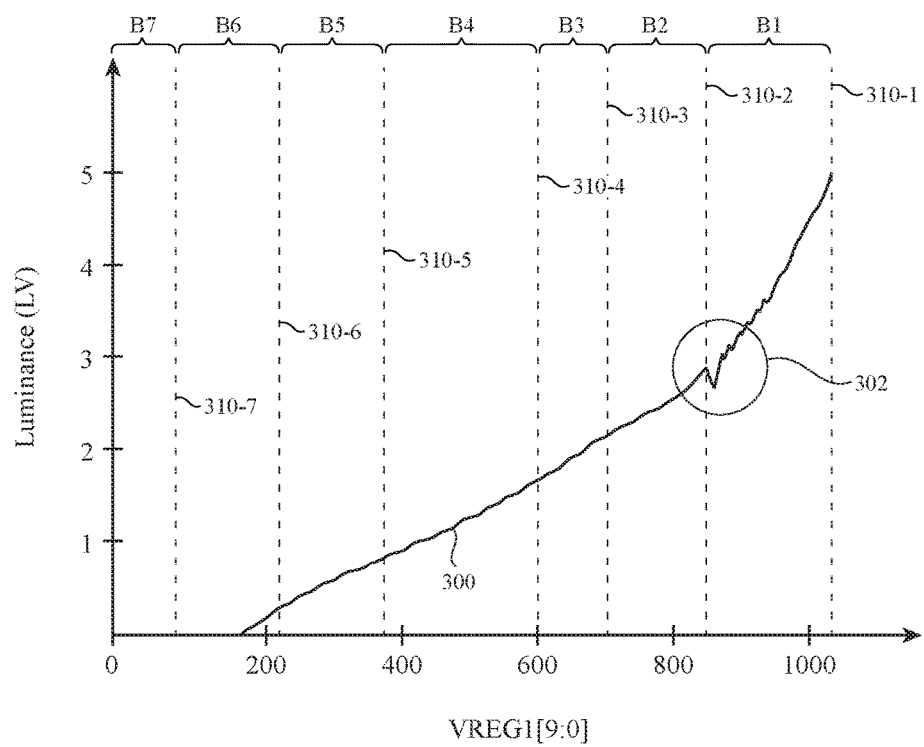
FIG. 10 is a plot of luminance versus display brightness settings showing a luminance jump.

In accordance with an embodiment, the register settings for the cascaded gamma structure (e.g., settings AM2, AM1, GR5-GR1) may be calibrated for a selected subset of the user-selected display brightness settings VREG1 (sometimes referred to as display brightness values or DBVs). FIG. 10 is a plot of luminance versus display brightness settings. Specific VREG1 settings at which calibration can be performed is indicated by the dotted lines 310-1, 310-2, 310-3, . . . , and 310-7. As shown in FIG. 10, the brightness tuning interval between lines 310-1 and 310-2 may define a first dimming band B1, the brightness tuning interval between lines 310-2 and 310-3 may define a second dimming band B2, the brightness tuning interval between lines 310-3 and 310-4 may define a third dimming band B3, and so on for seven bands (in this particular example). This is merely illustrative. In general, any suitable number of dimming bands of varying ranges can be used.

Consider a scenario in which a user inputs a command to an electronic device to gradually dim the brightness of the display. In such scenarios, it is generally desirable for the device to lower the luminance of the display at a smooth rate to help provide a pleasant user experience. When the user brightness settings correspond to intermediate display brightness settings between successive calibration points, interpolation circuitry may be used to perform interpolation on the calibrated values to generate corresponding interpolated register settings for the gamma structure so that desired reference voltages V255-V1 can be properly generated. Conventional interpolation circuitry, however, is only capable of performing interpolation in the digital domain. Just relying on digital interpolation when using the cascaded gamma structure, where each tap point is referenced to all register settings above the desired tap point, will accumulate errors and can often lead to luminance jumps (as shown in region 302 of FIG. 10) and undesired color shifts in the display.

Referring back to FIG. 9, circuitry 230 may be provided with interpolation logic 298 that is capable of performing interpolation in the voltage domain. As shown in FIG. 9, interpolation logic 298 may receive brightness settings VREG1 and registers settings AM and GR that control the cascaded gamma structure. In particular, interpolation logic 298 may perform voltage interpolation based on the received settings and generate corresponding adjusted settings AM' and GR' for controlling each of the multiplexers in the respective DAC circuits in the cascaded gamma structure.

Figure 11:
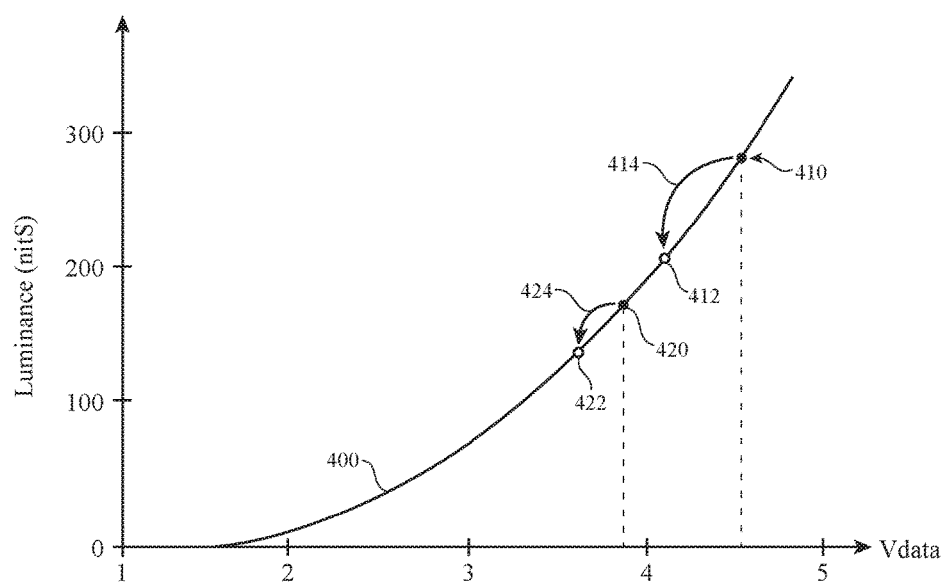
FIG. 11 an electro-optical response curve showing different display operating points in accordance with an embodiment.

FIG. 11 is a diagram of an electro-optical response curve showing different display operating points in accordance with an embodiment. As shown in FIG. 11, curve 400 plots luminance (in units of nits or $cd/m^2$) versus analog signal Vdata. In this example, point 410 on curve 400 may correspond to a maximum VREG1 setting of 1023 (aligned to the right band edge of dimming band B1 in FIG. 10) at a gray level of 255, whereas point 412 may correspond to a VREG1 setting of 851 (aligned to the left band edge of dimming band B1) at a gray level of 255. The gamma structure register settings should be calibrated for both of these points since they corresponding to the band edges. Any voltage level between the two points (as indicated by arrow 414), if not corresponding to one of the band edges, may require generation of register settings using the voltage interpolation logic 298 of FIG. 9.

As another example, point 420 on curve 400 may correspond to a maximum VREG1 setting of 1023 (aligned to the right band edge of dimming band B1 in FIG. 10) at a gray level of 191, whereas point 422 may correspond to a VREG1 setting of 851 (aligned to the left band edge of dimming band B1) at a gray level of 191. The gamma structure register settings should be calibrated for both of these points since they corresponding to the band edges. Any voltage level between the two points (as indicated by arrow 424), if not corresponding to one of the band edges, may require generation of register settings using the voltage interpolation logic 298 of FIG. 9. It may be worth noting that not all gray levels corresponding to the band edges are being calibrated. Since the cascaded gamma structure is only configured to generate specific reference voltage levels, only gray levels corresponding to the predetermined tap points should be calibrated.

Figure 12:
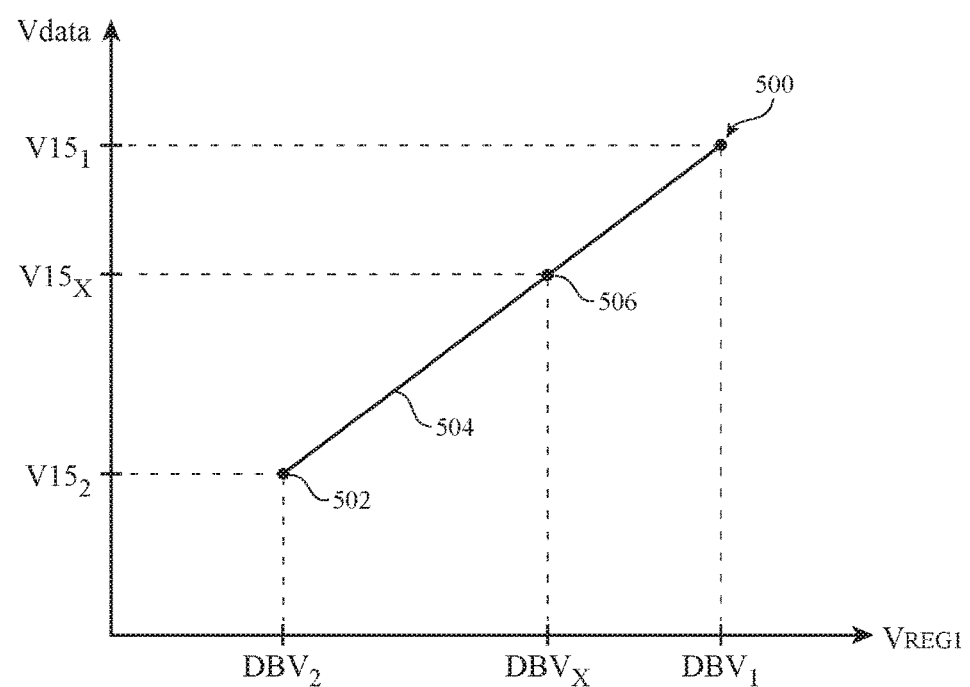
FIG. 12 is a diagram illustrating how an intermediate reference voltage setting can be derived via interpolation in accordance with an embodiment.

FIG. 12 is a diagram illustrating how an intermediate reference voltage setting can be derived via interpolation in accordance with an embodiment. As shown in FIG. 12, a first calibrated operating point 500 may correspond to a first display brightness setting (indicated as DBV1) and a first analog voltage value V15$_1$ (which represents the Vdata at a gray level of 15 at the right edge of band B1), whereas a second calibrated operating point 502 may correspond to a second display brightness setting (indicated as DBV2) and a second analog voltage value V15$_2$ (which represents Vdata at a gray level of 15 at the left edge of band B1). Line 504 connecting the two points 500 and 502 may represent an ideal transition between the two operating points.

Suppose, as an example, that brightness setting VREG1 is adjusted to an intermediate level between DBV1 and DBV2 (e.g., at level DBVx). In this example, ideally, the gamma structure would perform interpolation to obtain a corresponding V15$_X$ lying on the ideal curve 504. To accomplish this in the voltage domain, the following equation can be use:

$$V15_X = \left[\frac{V15_1 - V15_2}{DBV_1 - DBV_2} \times (DBV_X - DBV_1)\right] + V15_1 \quad (1)$$

As shown in equation 1, magnitudes may be referenced to the right band edge so values are subtracted from DBV$_1$ and V15$_1$ instead of DBV$_2$ and V15$_2$. The general expression for voltage V15 as a function of the T values of the cascaded gamma structure is as follows:

$$V15 = T15 \times [T31 \times T63 \times T127 \times T191 \times (T255-T1)]DBV + T1 \times DBV \quad (2)$$

Using equation 2, V15$_1$ and V15$_2$ can therefore be expressed as follows:

$$V15_1 = \alpha T15_1 + T1_1 \times DBV_1 \quad (3)$$

$$V15_2 = \beta T15_2 + T1_2 \times DBV_2 \quad (4)$$

where:

$$\alpha = [T31_1 \times T63_1 \times T127_1 \times T191_1 \times (T255_1-T1_1)]DBV_1 \quad (5)$$

$$\beta = [T31_2 \times T63_2 \times T127_2 \times T191_2 \times (T255_2 \times T1_2)]DBV_2 \quad (6)$$

In the equations above, α may refer to coefficients associated with the right edge, whereas β may refer to coefficients associated with the left edge. Substituting α and β into equation 1 yields:

$$V15_X = \left[\frac{\alpha T15_1 - \beta T15_2}{DBV_1 - DBV_2} \times (DBV_X - DBV_1)\right] + \alpha T15_1 + T1_1 \times DBV_X \quad (7)$$

In order to output V15$_X$, a corresponding T15$_X$ needs to be derived. This can be accomplished by defining a new variable η:

$$\eta T15_X = \quad (8)$$

$$\left[\frac{\alpha T15_1 - \beta T15_2}{DBV_1 - DBV_2} \times (DBV_X - DBV_1)\right] + \alpha T15_1 + T1_1 \times DBV_X$$

where:

$$\eta = [T31_X \times T63_X \times T127_X \times T191_X (T255_X - T1_X)] \quad (9)$$

Solving now for T15$_X$ and assuming T1$_1$≈T1$_2$≈T1$_X$:

$$T15_X = \left[\frac{\frac{\alpha}{\eta}T15_1 - \frac{\beta}{\eta}T15_2}{DBV_1 - DBV_2} \times (DBV_X - DBV_1)\right] + \frac{\alpha}{\eta}T15_1 \quad (10)$$

where:

$$\frac{\alpha}{\eta} = \left(1 - \frac{\Delta_{31}}{T31_1}\right)\left(1 - \frac{\Delta_{63}}{T63_1}\right)\left(1 - \frac{\Delta_{127}}{T127_1}\right)\left(1 - \frac{\Delta_{191}}{T191_1}\right)\left(1 - \frac{\Delta_{255}}{T255_1}\right) \quad (11)$$

and where:

$$\Delta_{31} = T31_1 - T31_X \quad (12)$$

$$\Delta_{63} = T63_1 - T63_X \quad (13)$$

In general, the delta Δ values can be computed on the fly during normal operation of the display (when it is desired to perform voltage interpolation). The remaining delta values can also be computed similar to equations 12 and 13. To minimize the number of divisions that need to be carried out by the voltage interpolation logic during normal operation, the inverse T values may be precomputed and stored in memory (e.g., burned into non-volatile memory in the electronic device). The values that may be stored may include:

$$a_0 = \frac{1}{T1_1}, a_1 = \frac{1}{T15_1}, a_2 = \frac{1}{T31_1}, a_3 = \frac{1}{T63_1}, \ldots, a_6 = \frac{1}{T255_1} \quad (14)$$

The a0-a6 values stored on the device along with the delta Δ values computed in real time can be used to compute α/η, which can be used to generate the desired T15$_X$ according to equation 10. T15$_X$ computed in this way can be used to adjust the gamma register settings GR1[7:0]' so that the sixth DAC circuit 270 outputs the desired V15. The steps described above for obtaining interpolated setting T15$x$ is merely illustrative. In general, interpolated T settings may be computed for any of the predetermined tap points (e.g., for display brightness settings associated with voltages V1, V31, V63, V127, V191, and V255 in FIG. 9).

The steps and equations shown above are merely illustrative and are not intended to limit the scope of the present invention. Equations 11-14 above show computation associated with the right edge of band B1. In other suitable embodiments, similar values may be computed for the left edge of band B1 (e.g., edge 310-2 of FIG. 10), for band edge 310-3, for band edge 310-4, etc. In other words, the voltage interpolation can be performed for any dimming band that is bounded by calibrated operating points.

Figure 13:
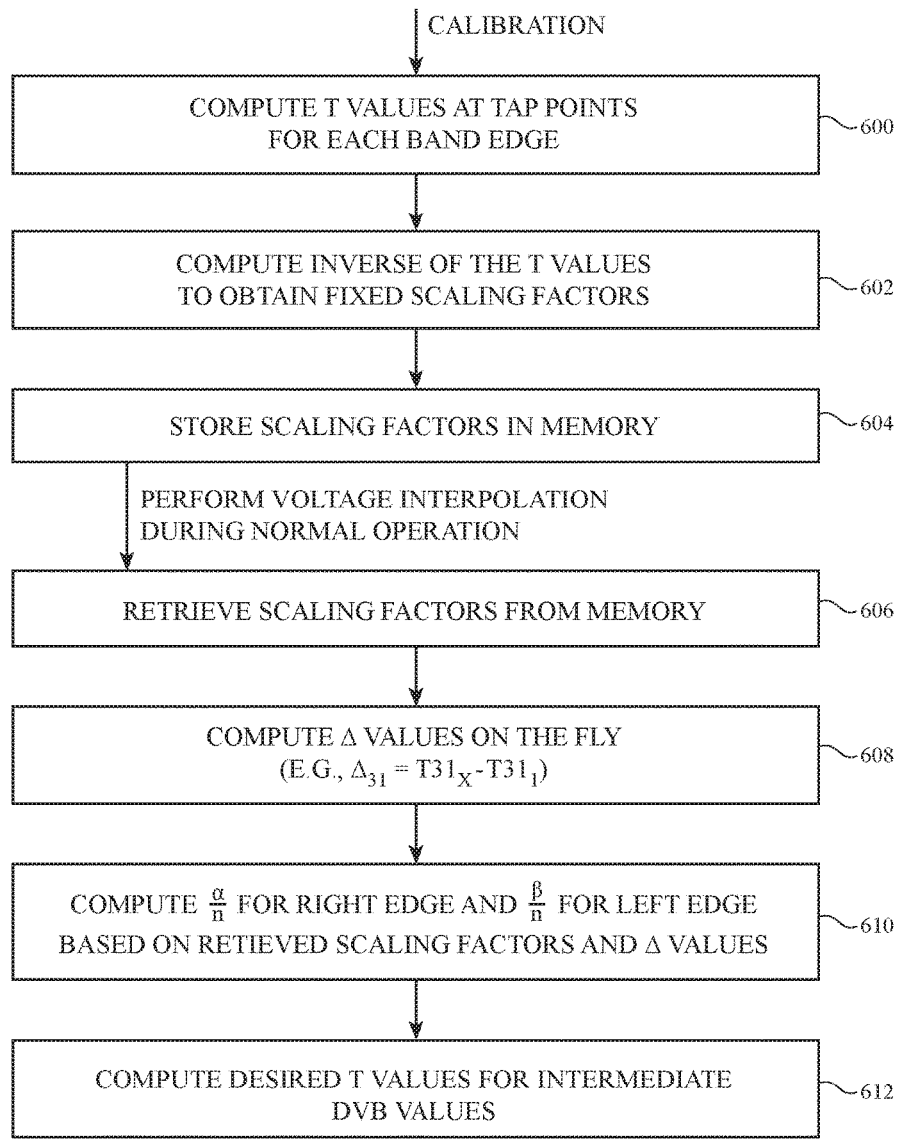
FIG. 13 is a flow chart of illustrative steps involved in performing interpolation in the voltage domain in accordance with an embodiment.

Interpolation in the voltage domain can be performed during normal operation for each of the tap points in this way (as illustrated in the flow chart of FIG. 13). Following calibration of each band edge, the T values corresponding to the predetermined tap points may be computed for each band edge (at step 600). For example, $T1_1$, $T15_1$, $T31_1$, ..., and $T255_1$ may be computed for the right edge of the first band edge (e.g., edge 310-1 in FIG. 10). As another example, $T1_2$, $T15_2$, $T31_2$, ..., and $T255_2$ may be computed for the right edge of the second band edge (e.g., edge 310-2 in FIG. 10). As yet another example, $T1_3$, $T15_3$, $T31_3$, ..., and $T255_3$ may be computed for the right edge of the third band edge (e.g., edge 310-3 in FIG. 10).

At step 602, an inverse of the T values gathered during step 600 may be computed to obtain the fixed scaling factors (e.g., scaling factors such as those shown in equation 14). These scaling factors may be stored in memory such as non-volatile memory circuitry within the electronic device (e.g., stored in memory that is part of storage circuitry 28 in FIG. 5).

During normal operation, voltage interpolation may selectively be performed when the display brightness setting falls between precalibrated settings. In response to detecting that voltage interpolation needs to be performed, the interpolation logic (e.g., interpolation logic 298 in FIG. 9) may retrieve the stored scaling factors from memory (step 606).

At step 608, the delta values Δ may be computed on the fly using calculations of the type shown and described in connection with equations 12 and 13. At step 610, a corresponding α/η value may be computed for the right edge whereas a corresponding β/η value may be computed for the left edge (if necessary) based on the retrieved scaling factors and the delta values using an expression such as that disclosed in equation 11 (as an example).

At step 612, the desired T value may then be computed for the intermediate display brightness setting using an expression such as that disclosed in equation 10 (as an example). Voltage interpolation performed in this way can help minimize luminance jumps and undesired color shifts.

The foregoing is merely illustrative of the principles of this invention and various modifications can be made by those skilled in the art without departing from the scope and spirit of the invention. The foregoing embodiments may be implemented individually or in any combination.

What is claimed is:

1. Display circuitry, comprising:
 a display controller configured to generate register settings;
 a plurality of cascaded data converters configured to generate reference voltages;
 interpolation circuitry configured to receive the register settings from the display controller, to perform voltage interpolation on the received register settings, and to output corresponding interpolated register settings for configuring the plurality of cascaded data converters; and
 memory for storing predetermined scaling factors that are retrieved when performing the voltage interpolation, wherein each of the plurality of cascaded data converters is associated with a respective digital value, the reciprocal of which is equal to the predetermined scaling factors.

2. The display circuitry defined in claim 1, wherein the interpolation circuitry is configured to compute delta values based on the digital values associated with the plurality of cascaded data converters.

3. The display circuitry defined in claim 2, wherein the interpolation circuitry is further configured to compute a ratio based on the predetermined scaling factors and the delta values, wherein the ratio is a product of factors, and wherein each of the factors includes a respective one of the delta values multiplied by a corresponding one of the predetermined scaling factors.

4. The display circuitry defined in claim 1, wherein one of the plurality of cascaded data converters is controlled by a user display brightness setting.

5. The display circuitry defined in claim 4, further comprising:
 peak luminance control and brightness control circuitry that outputs a peak luminance scaling factor that controls another one of the plurality of cascaded data converters.

6. The display circuitry defined in claim 5, wherein the interpolation circuitry receives only a selected one of the user display brightness setting and the peak luminance scaling factor.

7. A method for operating a display characterized by a plurality of dimming bands each having a right edge and a left edge, the method comprising:
 placing the display in a first state using a first display brightness setting that corresponds to one of the right and left edges of a first dimming band in the plurality of dimming bands, wherein the plurality of dimming bands are a function of display brightness settings at a given gray level;
 placing the display in a second state by adjusting the first display brightness setting to a second display brightness setting; and
 in response to determining that the second display brightness setting falls between the right and left edges of the first dimming band, performing voltage interpolation operations to obtain additional display control settings, wherein performing the voltage interpolation comprises computing an intermediate value based on the right and left edges of the first dimming band at the given gray level.

8. The method defined in claim 7, wherein performing the voltage interpolation operations comprises interpolating between a first calibrated voltage value corresponding to the right edge of the first dimming band and a second calibrated voltage value corresponding to the left edge of the first dimming band.

9. The method defined in claim 8, wherein the first and second calibrated voltage values correspond to an identical gray level.

10. The method defined in claim 8, wherein performing the voltage interpolation operations comprises performing a linear interpolation between the first and second calibrated voltage values.

11. The method defined claim 7, wherein performing the voltage interpolation comprises performing the voltage interpolation operations to obtain the additional display control settings for a set of predetermined tap points.

12. The method defined in claim 11, further comprising:
using the set of predetermined tap points to define a gamma characteristic for the display.

13. The method defined in claim 12, further comprising:
configuring a plurality of cascaded digital-to-analog converters using the additional display control settings, wherein the plurality of cascaded digital-to-analog converters each have an output that is coupled to a respective one of the predetermined tap points.

14. The method defined in claim 7, further comprising:
performing calibration operations to obtain display control settings corresponding to the first display brightness setting.

15. A method for operating a display characterized by a plurality of dimming bands defined by edges, the method comprising:
performing calibration to obtain calibrated display control settings corresponding to only the edges of the dimming bands, wherein the dimming bands are a function of externally-supplied display brightness settings;
storing the calibrated display control settings; and
performing voltage interpolation for display brightness settings that lie within the edges of a given dimming band in the plurality of dimming bands.

16. The method defined in claim 15, further comprising:
computing delta values for a set of predetermined tap points.

17. The method defined in claim 15, further comprising:
computing a first ratio for a first edge of the given dimming band; and
computing a second ratio for a second edge of the given dimming band.

18. The method defined in claim 17, further comprising:
computing a gamma register setting based on the first ratio, the second ratio, and a current display brightness setting for the display; and
using the gamma register setting to at least partially configure a digital-to-analog converter in a plurality of cascaded digital-to-analog converters.

19. The method of claim 15, wherein a first dimming band in the plurality of dimming bands corresponds to a first range of the display brightness settings, and wherein a second dimming band in the plurality of dimming bands corresponds to a second range of the display brightness settings that is non-overlapping with the first range.

20. The method of claim 19, wherein the calibrated display control settings comprises a first calibrated voltage level corresponding to a right edge of the first dimming band and a second calibrated voltage level corresponding to a left edge of the first dimming band.

* * * * *